US012666638B1

(12) United States Patent
Chang

(10) Patent No.: US 12,666,638 B1
(45) Date of Patent: Jun. 23, 2026

(54) GATE ALL-AROUND (GAA) FIELD EFFECT TRANSISTORS (FETS) HAVING VERTICAL SOURCE AND DRAIN

(71) Applicant: Marvell Asia Pte Ltd, Singapore (SG)

(72) Inventor: Runzi Chang, Saratoga, CA (US)

(73) Assignee: Marvell Asia Pte Ltd, Singapore (SG)

( * ) Notice: Subject to any disclaimer, the term of this patent is extended or adjusted under 35 U.S.C. 154(b) by 645 days.

(21) Appl. No.: 18/297,617

(22) Filed: Apr. 9, 2023

Related U.S. Application Data

(60) Provisional application No. 63/329,518, filed on Apr. 11, 2022.

(51) Int. Cl.
| | |
|---|---|
| *H10D 30/43* | (2025.01) |
| *H10D 30/01* | (2025.01) |
| *H10D 30/67* | (2025.01) |
| *H10D 62/10* | (2025.01) |
| *H10D 64/01* | (2025.01) |
| *H10D 84/01* | (2025.01) |

(Continued)

(52) U.S. Cl.
CPC ........... *H10D 30/43* (2025.01); *H10D 30/014* (2025.01); *H10D 30/6729* (2025.01); *H10D 30/6735* (2025.01); *H10D 62/122* (2025.01); *H10D 64/017* (2025.01); *H10D 84/0167* (2025.01); *H10D 84/0186* (2025.01); *H10D 84/0188* (2025.01); *H10D 84/038* (2025.01); *H10D 84/856* (2025.01); *H10D 88/01* (2025.01); *H10W 20/427* (2026.01)

(58) Field of Classification Search
CPC .. H10D 30/43; H10D 30/014; H10D 30/6729; H10D 30/6735; H10D 62/122; H10D 64/017; H10D 84/0167; H10D 84/0186; H10D 84/0188; H10D 84/038; H10D 84/856; H10D 88/01; H01L 23/5286

See application file for complete search history.

(56) References Cited

U.S. PATENT DOCUMENTS

| | | | | | |
|---|---|---|---|---|---|
| 2020/0328212 | A1* | 10/2020 | Wu | ........................ | H10D 88/00 |
| 2023/0067311 | A1* | 3/2023 | Lai | ........................ | H10D 30/43 |

OTHER PUBLICATIONS

Applied Materials, Inc., "Vantage® RadOx™ RTP ," product information, pp. 1, May 6, 2005, as downloaded from https://ir.appliedmaterials.com/node/9406/pdf.

(Continued)

*Primary Examiner* — Fernando L Toledo
*Assistant Examiner* — Adam S Bowen
(74) *Attorney, Agent, or Firm* — Meitar Patents LTD.; Daniel Kligler

(57) ABSTRACT

A semiconductor device, includes: (a) a substrate, (b) a gate electrode, disposed on a surface of the substrate, and including a plate, orthogonal to the surface, and having openings, a longest axis of the openings is orthogonal to the surface, and (c) elements having a shape that fits in the openings, the elements (i) are orthogonal both to the surface and to the gate electrode, (ii) extend through the openings, and (iii) are surrounded by the gate electrode and spaced away from the surface, the elements including: a first section that is located on a first side of the gate electrode and serves as a source; and a second section that is located on a second side of the gate electrode and serves as a drain, the gate electrode (Continued)

configured to control movement of charge carriers between the source and the drain in response to an applied electrical signal.

14 Claims, 3 Drawing Sheets

(51) Int. Cl.

| | | |
|---|---|---|
| *H10D 84/03* | | (2025.01) |
| *H10D 84/85* | | (2025.01) |
| *H10D 88/00* | | (2025.01) |
| *H10W 20/41* | | (2026.01) |

(56) References Cited

OTHER PUBLICATIONS

Applied Materials, Inc., "AKT 55K5 PECVD, " product library, pp. 1-2, year 2023, as downloaded from https://www.appliedmaterials.com/us/en/product-library/akt-55ks-pecvd.html.

LAM Research Corporation, "Vector Product Family," product information, pp. 1-3, year 2023 as downloaded from https://www.lamresearch.com/product/vector-product-family/.

ASML, "EUV lithography systems," product information, pp. 1-4, years 2019-2022, as downloaded from https://www.asml.com/en/products/euv-lithography-systems.

Applied Materials Inc., "Centura® Etch," pp. 1-3, year 2023, as downloaded from https://www.appliedmaterials.com/us/en/semiconductor/products/shape/etch/centura-etch.html.

TEL—Tokyo Electron Limited, "Etch—Episode™ UL Series," pp. 1-4, years 1996-2023, as downloaded from https://www.tel.com/product/episode_ul.html.

TEL—Tokyo Electron Limited, "Etch Tactras ™ Series," product information, pp. 1-3, years 1996-2023, as downloaded from https://www.tel.com/product/tactras.html.

Wiki, "Short-channel effect", p. 1, year 2023, as downloaded from https://en.m.wikipedia.org/wiki/Short-channel_effect#:~: text=In%20electronics%2C%20short%2Dchannel%20effects,confinement%20and%20hot%20carrier%20degradation.

ASML, "DUV lithography machines," product information, pp. 1-4, years 2019-2022, as downloaded from https://www.asml.com/en/products/duv-lithography-systems.

* cited by examiner

*FIG. 5*

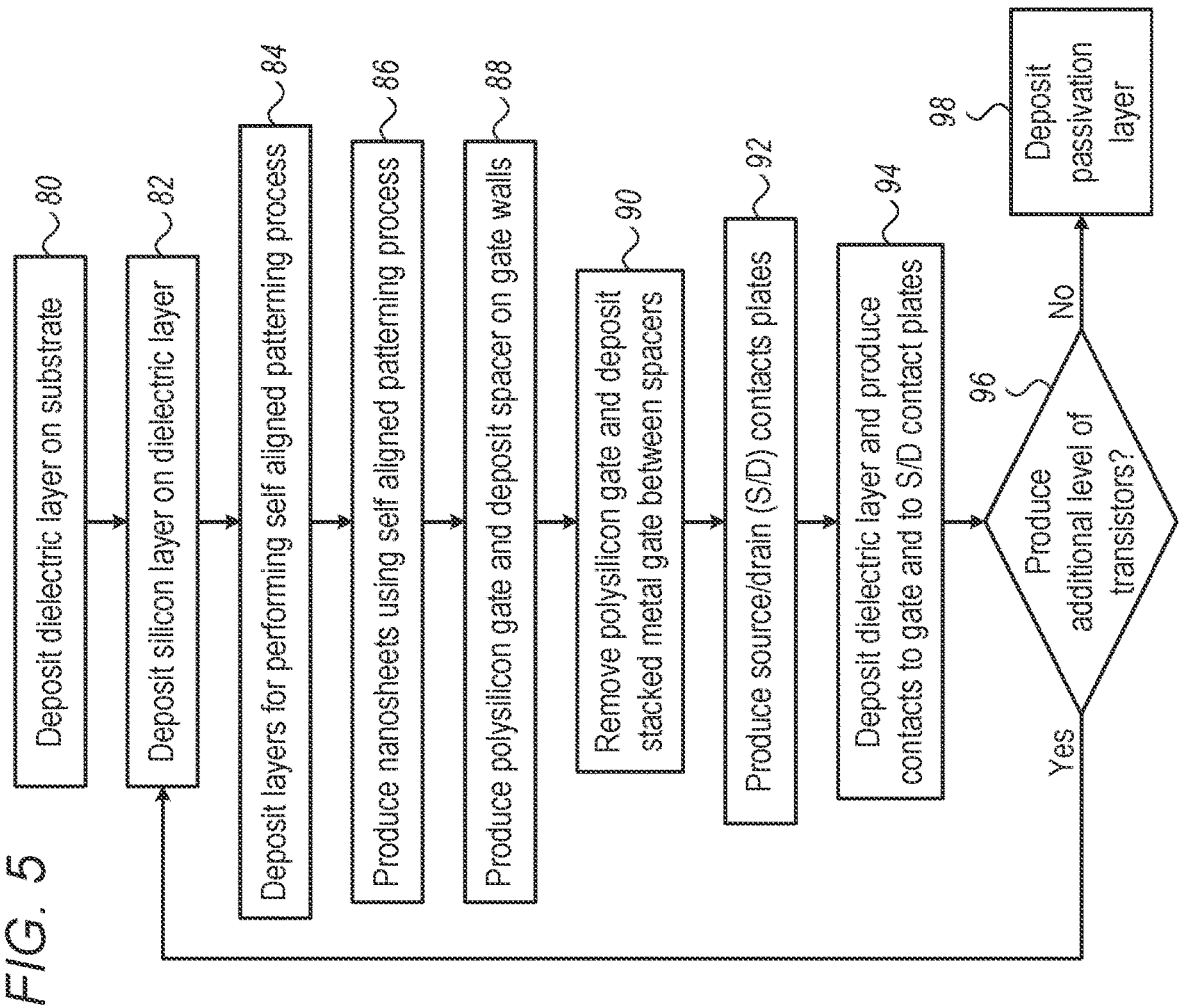

- Deposit dielectric layer on substrate ~80
- Deposit silicon layer on dielectric layer ~82
- Deposit layers for performing self aligned patterning process ~84
- Produce nanosheets using self aligned patterning process ~86
- Produce polysilicon gate and deposit spacer on gate walls ~88
- Remove polysilicon gate and deposit stacked metal gate between spacers ~90
- Produce source/drain (S/D) contacts plates ~92
- Deposit dielectric layer and produce contacts to gate and to S/D contact plates ~94
- Produce additional level of transistors? ~96
  - Yes
  - No
- Deposit passivation layer ~98

*FIG. 4*

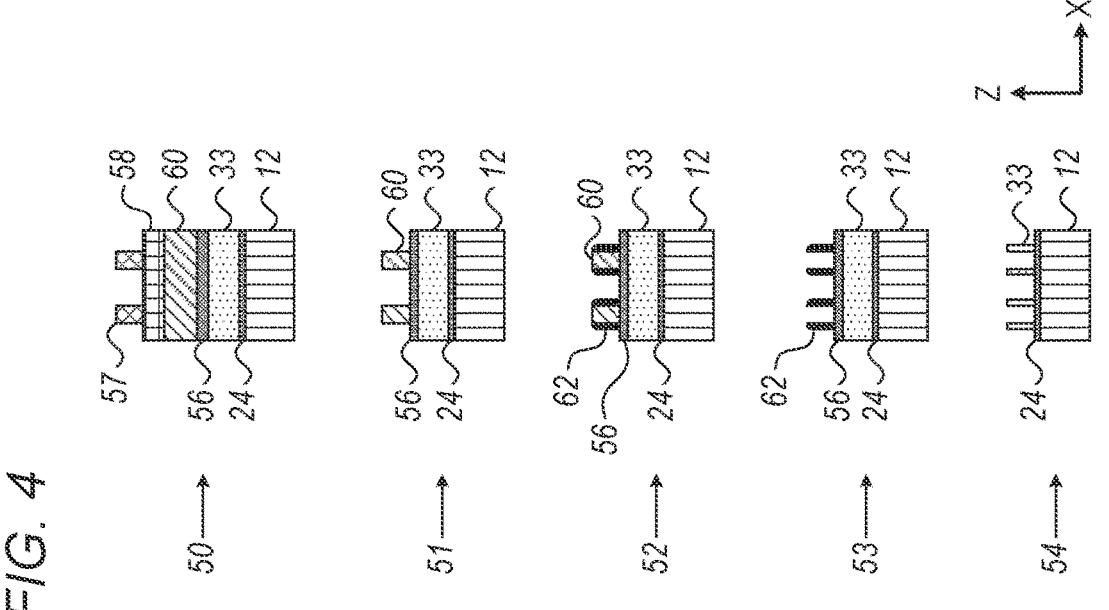

50
51
52
53
54

57 58 60 33 12 56 24
60 33 12 56 24
60 33 12 62 56 24
33 12 62 56 24
33 12 24

Z X

GATE ALL-AROUND (GAA) FIELD EFFECT TRANSISTORS (FETS) HAVING VERTICAL SOURCE AND DRAIN

CROSS-REFERENCE TO RELATED APPLICATIONS

This application claims the benefit of U.S. Provisional Patent Application 63/329,518, filed Apr. 11, 2022, whose disclosure is incorporated herein by reference.

FIELD OF THE DISCLOSURE

The present invention relates generally to electronic devices, and particularly to gate all-around (GAA) field effect transistors (FETs) having a vertical source and drain, and a fabrication methods thereof.

BACKGROUND

GAA FETs may have several configurations in which a floating source/drain element passes through a gate. Various techniques for fabricating GAA FETs are known in the art.

The description above is presented as a general overview of related art in this field and should not be construed as an admission that any of the information it contains constitutes prior art against the present patent application.

SUMMARY

An embodiment that is described herein provides a semiconductor device, including: (a) a semiconductor substrate, (b) a gate electrode disposed on a surface of the semiconductor substrate, the gate electrode including a plate, which is orthogonal to the surface, and having one or more openings, a longest axis of at least one of the openings is orthogonal to the surface, and (c) one or more elements having a shape that fits in the one or more openings, respectively, the one or more elements (i) are orthogonal both to the surface and to the gate electrode, (ii) extend through the one or more openings, respectively, and (iii) are surrounded by the gate electrode and spaced away from the surface, the one or more elements including: (i) a first section that is located on a first side of the gate electrode and serves as a source, and (ii) a second section that is located on a second side of the gate electrode and serves as a drain, the gate electrode being configured to control movement of charge carriers between the source and the drain in response to an applied electrical signal.

In some embodiments, the one or more openings of the gate electrode have a rectangular shape, and the one or more elements e one or more nanosheets, respectively, having a rectangular cross section. In other embodiments, the semiconductor device includes a gate dielectric layer, which is disposed at the opening between the gate electrode and the nanosheets to form a gate all-around (GAA) field effect transistor (FET) having a vertical channel on one or more surfaces of the nanosheets between the source and the drain. In yet other embodiments, the semiconductor device includes: (i) first contacts including first and second plates, the first and second plates being disposed along first and second sides of the gate electrode, respectively, the first plate is configured to electrically connect between the source and a first power source, and the second plate is configured to electrically connect between the drain and a second power source, and (ii) one or more second contacts, the one or more second contacts being configured to electrically connect between the gate electrode and a third power source.

In some embodiments, at least one of the first and second plates is: (i) disposed around the one of more nanosheets, and (ii) coplanar with the gate electrode. In other embodiments, the gate electrode and at least one of the nanosheets form a first gate all-around (GAA) field effect transistor (FET) having a first polarity, the semiconductor device further including a second GAA FET that is stacked over the first GAA FET, the second GAA FET having a second polarity that is different from the first polarity. In yet other embodiments, the second GAA FET includes: (a) an additional gate electrode, the additional gate electrode including an additional plate that is orthogonal to the surface and that is coplanar with the gate electrode of the first GAA FET; and (b) one or more additional nanosheets, the additional nanosheets (i) being orthogonal both to the surface and to the additional gate electrode, (ii) extending through at least one opening in the additional gate electrode, and (iii) being surrounded by the additional gate electrode and spaced away from the nanosheets of the first GAA FET.

In some embodiments, the semiconductor device includes electrical contacts which extend from at least the gate electrode of the first GAA FET, and which pass alongside the second GAA FET, the electrical contacts being configured to connect between the first GAA FET and a power source. In other embodiments, the first GAA FET has a first footprint on the surface, the second GAA FET has a second footprint on the surface that is smaller than and contained within the first footprint, and the electrical contacts have a third footprint on the surface, falling within the first footprint but outside the second footprint. In yet other embodiments, the semiconductor device includes a dielectric layer, the dielectric layer being: (i) disposed between the first GAA FET and the second GAA FET, and (ii) configured to electrically isolate between the first GAA FET and the second GAA FET.

There is additionally provided, in accordance with an embodiment of the present invention, a method for fabricating a semiconductor device, the method includes: disposing, on a surface of a semiconductor substrate, a gate electrode including a plate, which is orthogonal to the surface, the plate having one or more openings, and a longest axis of at least one of the openings is orthogonal to the surface. One or more elements having a shape that fits in the one or more openings, respectively, are formed, the one or more elements (i) being orthogonal both to the surface and to the gate electrode, (ii) extending through the one or more openings, respectively, and (iii) being surrounded by the gate electrode and spaced away from the surface, and forming the one or more elements includes (i) positioning a first section of the one or more elements on a first side of the gate electrode to serve as a source, and (ii) positioning a second section of the one or more elements on a second side of the gate electrode to serve as a drain.

In some embodiments, the one or more openings of the gate electrode have a rectangular shape, and forming the one or more elements includes forming one or more nanosheets, respectively, having a rectangular cross section corresponding to the rectangular shape of the one or more openings. In other embodiments, forming the one or more nanosheets includes: (i) disposing on the semiconductor substrate at least a semiconductor layer and a stack of dielectric layers, (ii) patterning a mandrel mask in at least one of the dielectric layers of the stack, (iii) patterning a spacer at sidewalls of the mandrel mask and removing the mandrel mask, and (iv)

patterning the nanosheets in the semiconductor layer by transferring a pattern of the spacer to the semiconductor layer.

The present disclosure will be more fully understood from the following detailed description of the embodiments thereof, taken together with the drawings in which:

BRIEF DESCRIPTION OF THE DRAWINGS

FIG. 4 is a schematic, sectional view of a process sequence for fabricating vertical nanosheets of the semiconductor devices of FIGS. 1 and 2, in accordance with an embodiment that is described herein; and FIG. 5 is a flow chart that schematically illustrates a method for fabricating the semiconductor devices of FIGS. 1 and 2 in accordance with an embodiment that is described herein.

DETAILED DESCRIPTION OF EMBODIMENTS

Figures 1A, 1B, 1C, 1D:
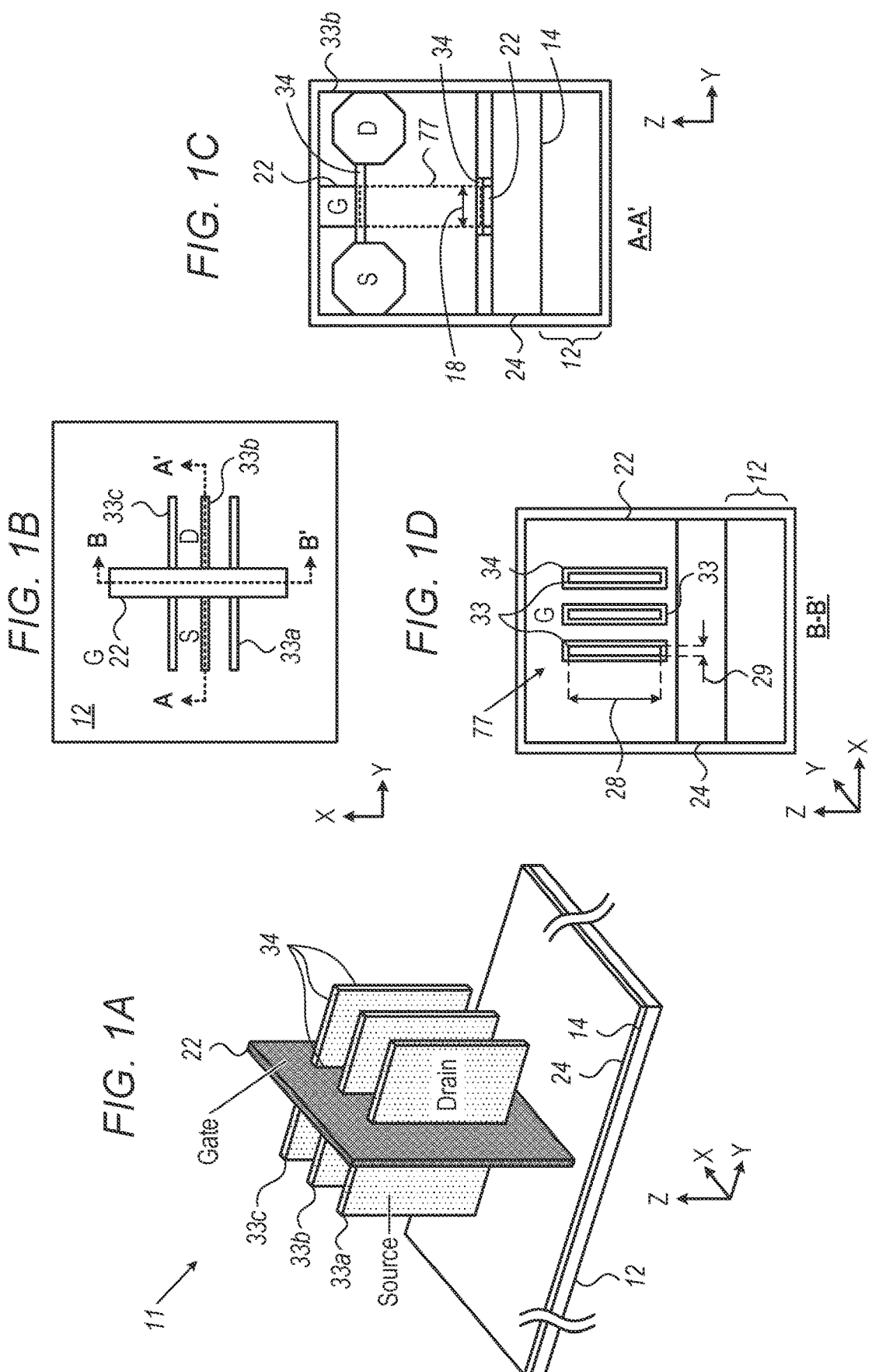
FIG. 1A is a schematic, pictorial illustration of a semiconductor device, in accordance with an embodiment that is described herein.
FIG. 1B is a top view of the semiconductor device of FIG. 1A, in accordance with an embodiment that is described herein.
FIGS. 1C and 1D are sectional views of the semiconductor device of FIG. 1A, in accordance with an embodiment that is described herein.

Semiconductor devices typically comprise field-effect transistors (FETs) used for processing data and for managing operations in the device, such as (i) reading, writing, and refreshing memory, and (ii) on/off switching the operation of logic circuits. A FET comprises a source and a drain formed in a semiconductor (e.g., silicon) substrate or layer, and a multilayered gate electrode, also referred to herein as a gate, configured to control the mobility of charge carriers along a channel located in the semiconductor substance between the source and the drain. The effective size of the channel is also referred to as the effective length of the FET, or the channel length. The channel length is a key factor for determining the transistor performance, and therefore, continuous miniaturization (also referred to herein as scaling) of the channel length is essential for improving the performance and increasing the functionality of semiconductor devices.

At some point in time, however, the scaling of channel length combined with increased performance requirements, caused several quality and reliability problems, such as undesired power leakage, and shorts and/or opens in junctions of the transistor. Such problems in turn caused excess temperature, excess current or voltage, and other undesirable phenomena within the FET, resulting in failures in the operation and reliability of the semiconductor device.

In order to solve these problems, chip designers have altered the structure of the FET from a two-dimensional (2D) metal-oxide semiconductor (MOS) FET to a three-dimensional (3D) finFET, and subsequently, to a 3D gate all-around (GAA) FET. The GAA FET comprises a gate electrode disposed orthogonally to the substrate and having multiple openings, and one or more floating nanowires or nanosheets, each of which is disposed parallel to the substrate and is orthogonal to the gate, and traverses a respective opening of the gate. The use of GAA FET has enabled further miniaturization of the channel length that improves the electrical performance, but has also increased the complexity and costs associated with the fabrication of the GAA FET. Moreover, the increased structural complexity of the GAA FET has reduced the reliability of semiconductor devices comprising such GAA FETs. For example, variations in the fabrication process of an isolating spacer structure formed between the gate electrode and the source and drain of the GAA FET, may result in a short between the gate electrode and the respective source or drain, and thereby, to a reliability failure of the semiconductor device.

Embodiments of the present disclosure that are described herein, provide a GAA FET having vertically disposed source and drain, and techniques for improving the quality, reliability and fabrication costs of a semiconductor device comprising one or more of the GAA FETs, each of which comprises one or more vertical source and drain.

In some embodiments, the semiconductor device comprises (i) a semiconductor substrate, (ii) a gate electrode, and (iii) one or more nanosheets or other suitable elements whose structure and functionality are described below.

In some embodiments, the gate electrode comprises a plate, which is disposed on a surface of the semiconductor substrate, and is orthogonal to the surface. The gate electrode has one or more openings, in the present example, without limitation, three rectangular openings. The long axis of each rectangular opening is orthogonal to the surface of the substrate, and one of the short axes of each rectangular opening is parallel to the surface of the substrate.

In some embodiments, the semiconductor device comprises three nanosheets shaped to fit in the three rectangular openings, respectively. Moreover, the nanosheets are orthogonal both to the surface of the substrate and to the gate electrode, and each of the nanosheets extends through the respective opening. In such embodiments, the first and second sections of each nanosheet are located at first and second sides of the gate electrode, and serve as the source and drain of the GAA FET, respectively. The structure and functionality of the GAA FET are described in more detail in FIGS. 1A-1D above.

It is noted that in the configuration described above, when applying a first voltage between the gate electrode and the substrate, a depletion zone is formed in a channel of the GAA FET, and when applying a second voltage between the source and drain located at the sides of the channel of the GAA FET. The channel is configured to move charge carriers, such as electrons or holes, therethrough when the GAA FET is in an open position. In other words, the first voltage applied to the gate electrode, and the second voltage applied between the source and drain, are configured to control the movement of the charge carriers within the channel. The channel is located within each of the openings of the gate electrode. Moreover, in this configuration, the largest dimension of the channel is orthogonal to the surface of the substrate, and therefore, the disclosed GAA FET is also referred to herein as a vertical channel GAA FET. In principle, it is possible to produce multiple nanosheets arranged parallel to the substrate, so that the largest dimension of the channel is parallel to the surface of the substrate. This configuration is also referred to herein as a horizontal channel GAA FET. However, the process integration of horizontal channel GAA FETs is more complex in comparison to that of the vertical channel GAA FET, and horizontal channel GAA FETs are prone to the quality and reliability problems described above.

In some embodiments, the semiconductor device may have two types of GAA FETs having different polarities: (i) a p-gate GAA FET, whose gate electrode is implanted with p-type (e.g., boron) ions, and the source and drain are implanted with n-type (e.g., phosphorous) ions, and (ii) an n-gate GAA FET, whose gate electrode is implanted with n-type ions, and the source and drain are implanted with p-type ions.

In some embodiments, the semiconductor device may have multiple GAA FETs stacked on top of one another and separated by one or more dielectric layers. In the present example, the semiconductor device comprises (i) an n-gate GAA FET at the lower level, (ii) a p-gate GAA FET at the upper level, and (iii) a dielectric layer configured to physically separate and electrically isolate between the stacked GAA FETs. In some embodiments, the n-gate GAA FET has a first footprint on the surface of the substrate, the p-gate GAA FET has a second footprint on the substrate surface, smaller than and contained within the first footprint.

In such embodiments, the semiconductor device comprises first electrical contacts, configured to electrically connect between the p-gate GAA and any suitable entity (e.g., a power source or another GAA FET), and second electrical contacts, configured to electrically connect between the n-gate GAA and any suitable entity. In some embodiments, (i) the first electrical contacts have a third footprint on the substrate surface, the third footprint falling within the first footprint but outside the second footprint, and (ii) the second electrical contacts that typically fall within the second footprint. A detailed description of the stacked GAA FETs and the electrical contacts are described below in FIGS. 2 and 3, respectively.

In some embodiments, the nanosheets of the vertical channel GAA FET are fabricated using a self-aligned patterning process, which (i) simplifies the fabrication process of the vertical channel GAA FET in comparison to that of the horizontal channel GAA FET, and (ii) enables further miniaturization of the nanosheets.

The description above is presented as a general overview of embodiments of the present disclosure, which are described in detail herein.

FIG. 1A is a schematic, pictorial illustration of a semiconductor device 11, in accordance with an embodiment that is described herein. Semiconductor device 11 comprises a gate all-around (GAA) field effect transistor (FET), and is also referred to herein as a device 11, for brevity.

In some embodiments, device 11 comprises a semiconductor substrate 12, fabricated from silicon or any other suitable semiconductor substance, and a gate electrode, referred to herein as a gate 22, which is formed on a surface 14 of substrate 12, or on a surface of a dielectric layer 24 formed over surface 14. Layer 24 is shown and described in detail in FIGS. 1C and 1D below. In an XYZ coordinate system of device 11, surface 12 is coplanar with an XY plane of the XYZ coordinate system, and gate 22 comprises a stack (not shown) of multiple layers (e.g., hafnium oxide, titanium nitride, titanium aluminum, and tungsten) arranged in any suitable configuration, such as but not limited to a U-shape, to produce a metal-based gate electrode.

In other embodiments, substrate 12 comprises any suitable material(s) other than semiconductor. For example, substrate 12 may comprise glass or any other suitable material having a a coefficient of thermal expansion (CTE)

that matches the CTE of gate 22, so as to prevent undesired stress and strain at the interface between substrate 12 and gate 22.

In the present example, gate 22 comprises a plate having a rectangular cross section, also referred to herein as a rectangular plate that has two surfaces coplanar with an XZ plane of the XYZ coordinate system. In other words, the long axes of gate 22 are parallel to the X- and Z-axes of the XYZ coordinate system, thus, gate 22 is orthogonal to surface 14. In other embodiments, gate 22 may be disposed at any other suitable angle relative to an outer surface of substrate 12.

In some embodiments, gate 22 has one or more openings 77 shown in a B-B' sectional view, and described in detail below.

In some embodiments, device 11 comprises one or more elements configured to fit in the one or more openings 77, respectively. In the present example, openings 77 have a rectangular shape, and the aforementioned elements of device 11 comprise three plates, referred to herein as nanosheets 33a, 33b and 33c having a rectangular shape that fits in the rectangular shape of openings 77. In alternative embodiments, at least one of openings 77 and the elements may have a shape other than the rectangular shape described above. For example, device 11 may comprise an opening 77 and at least a section of the element, both having a barrel shape with convex walls or concave walls in a YZ plane.

In some embodiments, nanosheets 33a-33c have a similar geometrical structure with typical dimensions of: (i) between 1 nm and 10 nm along the X-axis, (ii) between 10 nm and 10 μm along the Y-axis, and (i) between 1 nm and 200 nm along the Z-axis.

In some embodiments, a dielectric layer 34 is formed on the outer surface of each nanosheet 33, in the present example, the dielectric layer comprises a silicon-nitride compound (e.g., $Si_3N_4$) or any other suitable dielectric, which is configured to serve as the gate dielectric of the GAA FET, as described in the overview above, in in further detail below.

FIG. 1B is a top view of semiconductor device 11, in accordance with an embodiment that is described herein. In some embodiments, nanosheets 33a-33c extend through the three openings 77, respectively, and as shown in the top view of FIG. 1B, nanosheets 33a-33c are orthogonal both to (i) surface 14 of substrate 12, and (ii) gate 22.

In some embodiments, each nanosheet 33 has first and second sections located, along the Y-axis, at first and second sides of gate 22, respectively.

In some embodiments, the size of gate 22 along the Y-axis is approximately similar to the size of a channel of the GAA FET of device 11, and the first and second sections of each of nanosheets 33a-33c, serve as source and drain of device 11, respectively. Sectional views A-A' and B-B' are shown in FIGS. 1B and 1n two additional Figs. described herein.

FIG. 1C is an A-A' sectional view of device 11 along nanosheet 33b, in accordance with an embodiment that is described herein.

In the example of FIG. 1C, nanosheet 33b extends through opening 77 (shown in a dashed-line box) between the upper and lower sections of gate 22. In some embodiments, during the operation of device 11, (i) a first level of voltage (or any other suitable electrical signal) is applied (via terminals shown in FIG. 3 below) between gate 22 and substrate 12, and (ii) a second level of voltage (or any other suitable electrical signal) is applied between the source and the drain of nanosheet 33b. In the present example, the source and drain have an octagon shape, which depicts an optional shape of ions implanted in nanosheet 33*b*, and typically not a physical structure of nanosheet 33*b*. The octagon shape is provided by way of example, and in other configurations, the source and drain may have any other suitable shape. Alternatively, the entire surface of nanosheet 33*b* may be implanted by ions. It is noted that the shape of the source and drain in YZ plane, and a profile of the ion implantation along the X-axis are determined in accordance with the specification of device 11. In some embodiments, the sectional view of nanosheets 33*a* and 33*c* is typically similar to that of nanosheet 33*b*, but in other embodiments, at least one nanosheet 33 among nanosheets 33*a*-33*c* may have a different physical shape and/or a different profile and/or shape of the ion implantation.

In some embodiments, in response to applying the first level of voltage, a depletion zone is formed approximately at the surface of nanosheet 33*b*, which is located at the interface between nanosheet 33*b* and dielectric layer 34, and within the dashed line frame of opening 77. Moreover, the depletion zone enables the mobility of charge carriers, such as electrons or holes, along a channel formed, approximately on the surface of nanosheet 33*b*, between the source and the drain.

In some embodiments, in response to applying the second level of voltage between the source and drain of nanosheet 33*b*, the charge carriers flow approximately on the surface of nanosheet 33*b* at the interface with dielectric layer 34. When the GAA FET is open, the charge carriers flow along the Y-axis between the source(S) and the drain (D). In this example, a channel length 18 is defined along the Y-axis within the footprint of gate 22, as also described in FIG. 1B above.

It is noted that when the voltage applied between gate 22 and substrate 12 is smaller than a given threshold, none of the depletion zone and the channel are formed. Moreover, even when the depletion zone is formed, when the level of voltage between the source and the drain is smaller than a predefined threshold, the charge carriers will not flow between the source and the drain.

In some embodiments, device 11 comprises one or more dielectric layers, such as a layer 24, which is configured to electrically isolate between the GAA FET and substrate 12, and also for protecting substrate 12 during the fabrication process of nanosheets 33, as will be described in detail in FIG. 4 below. In the present example, the one or more dielectric layers may comprise layer 24, which has a multilayered structure comprising a silicon dioxide ($SiO_2$) layer formed over surface 14 of substrate 12, and a silicon nitride ($Si_3N_4$) layer formed over the surface of the silicon dioxide layer.

It is noted that the long axis of the channel within opening 77 is parallel to the Z-axis as shown in FIGS. 1C and 1*n* FIG. 1D below, and is orthogonal to surface 14 of substrate 12. This channel configuration is also referred to herein as a vertical channel. Moreover, the short axes of the channel are parallel to surface 14 of substrate 12, in the example of FIG. 1C, channel length 18 is parallel to the Y-axis, and the channel width (described in another inset) is parallel to the X-axis.

FIG. 1D is a B-B' sectional view of device 11, in accordance with an embodiment that is described herein. In some embodiments, dielectric layer 34 surrounds each nanosheet 33 fits in a respective opening 77. A double headed arrow 28 represents the longest dimension of the vertical channel, and a width 29 of nanosheet 33, which is also the effective width of the channel, is represented by a double headed arrow. In accordance with the description of FIG. 1C above, when the GAA FET of device 11 is operating and open, the charge carriers flow along the Y-axis on the outer surfaces of nanosheets 33, approximately at the interface between nanosheets 33 and dielectric layer 34.

It is noted that even though the charge carriers flow along the Y-axis, the channel is referred to as a vertical channel because the largest dimension of the channel is parallel to the Z-axis, which is vertical relative to surface 14 of substrate 12.

Figure 3:
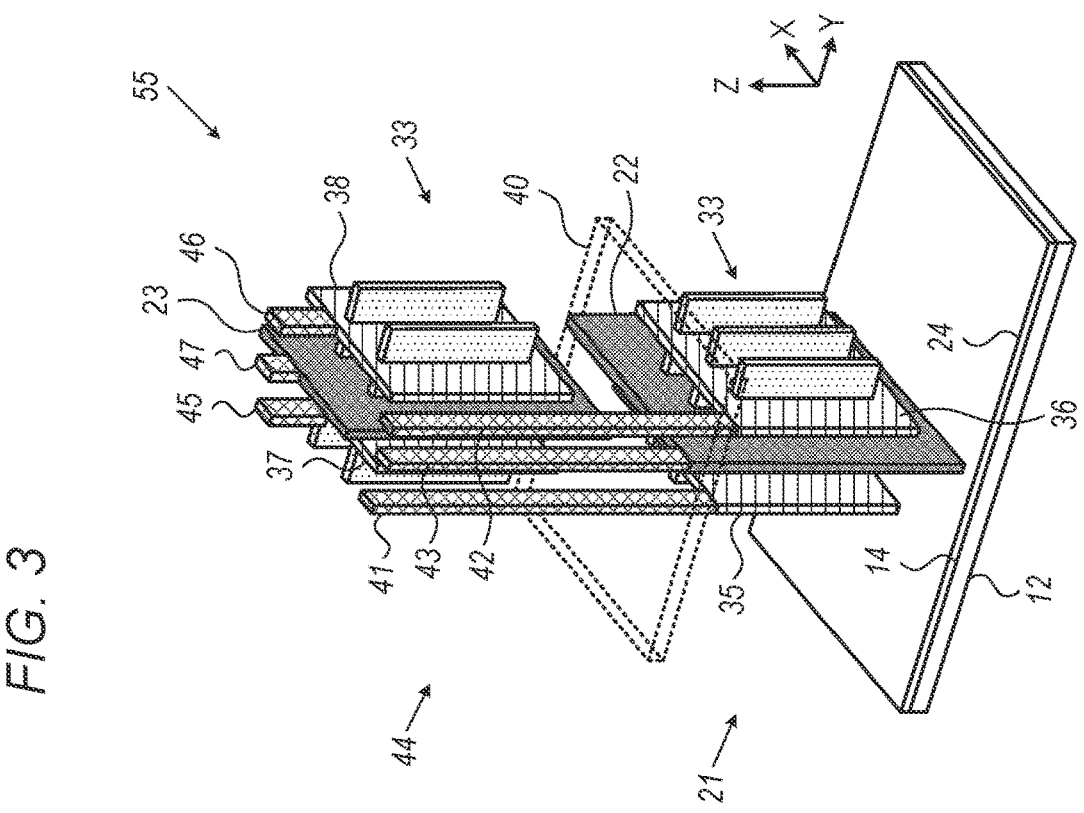
FIG. 3 is a schematic, pictorial illustration of terminals connected to the semiconductor device of FIG. 2, in accordance with an embodiment that is described herein.

Reference is now made back to the general view of FIG. 1A. In the present example, device 11 comprises three GAA FETs whose charge carriers flow along the Y-axis of nanosheets 33*a*, 33*b* and 33*c*, respectively. Nanosheets 33 of the respective GAA FETs are arranged along the X-axis and may be connected in parallel as shown in FIG. 3 below, or using any other suitable configuration. In other embodiments, device 11 may comprise any other suitable number of GAA FETs by disposing any suitable number of nanosheets 33 along the X-axis. In some embodiments, the footprint of device 11 along the X-axis is dictated by the number of nanosheets 33, the width 29 of each nanosheet 33, and the space between adjacent nanosheets 33, which is typically filled with either (i) silicon (or any other suitable semiconductor layer) to enable electrical connection between two or more adjacent nanosheets 33, or (ii) a dielectric substance to electrically isolate between adjacent nanosheets 33.

In some embodiments, width 29 of nanosheets 33 can be controlled tightly using a self-aligned patterning process described in detail in FIG. 4 below. In the example configuration of device 11, nanosheets 33 are floating above substrate 12, in other words, nanosheets 33 are surrounded by: (i) gate 22 at the channel area, and (ii) dielectric layers, such as layer 24, out of the cannel area, and therefore, are spaced away from substrate 12. Layer 24 is configured to electrically isolate between nanosheets 33 and substrate 12, as shown in FIGS. 1C and 1D.

Figure 2:
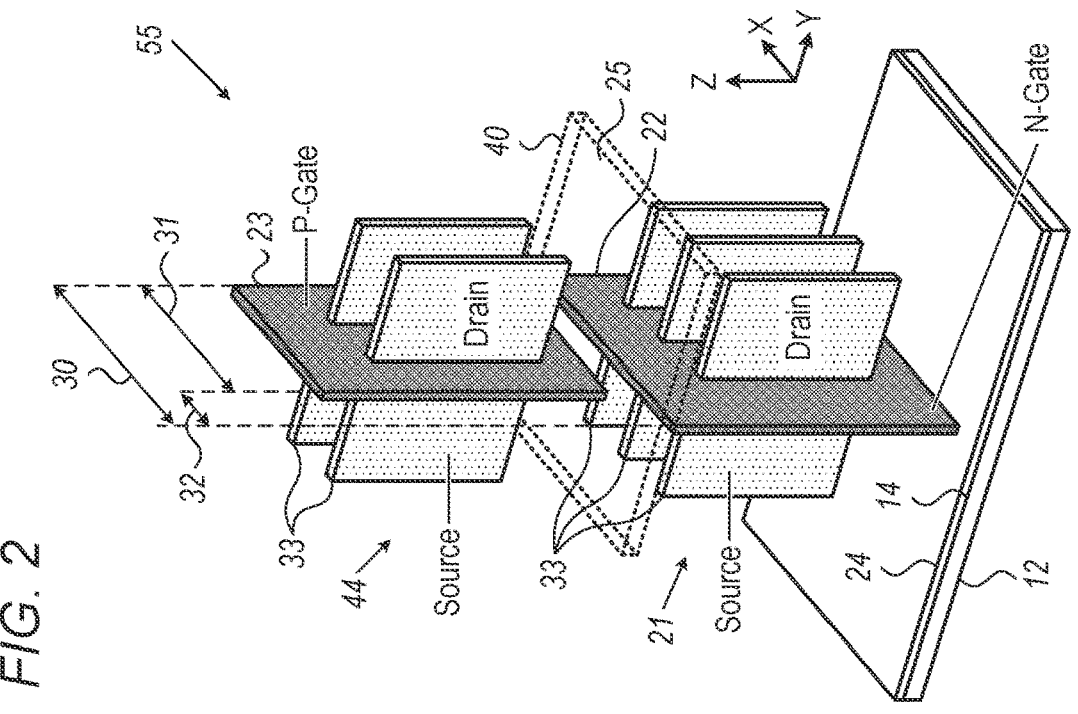
FIG. 2 is a schematic, pictorial illustration of another semiconductor device, which comprises the semiconductor device of FIG. 1A, in accordance with an embodiment that is described herein.

FIG. 2 is a schematic, pictorial illustration of a semiconductor device 55, in accordance with an embodiment that is described herein. Semiconductor device 55 is also referred to herein as device 55, for brevity.

In some embodiments, device 55 comprises a sub-device 21, which is similar to device 11 of FIG. 1A above, and additional structures described herein. In the present example, sub-device 21 comprises one or more, e.g., three n-gate GAA FETs, whose gate 22 is implanted with n-type ions, and the source and drain of nanosheets 33 are implanted with p-type ions. In this configuration, the n-gate GAA FETs of sub-device 21 comprise a pnp junction formed at the channel between the n-type gate 22 and the p-type source and drain of nanosheets 33.

In some embodiments, device 55 comprises a dielectric layer 40 disposed over device 11, note that in other embodiments, dielectric layer 40 may be thicker (along the Z-axis) than shown in FIG. 2, and may be disposed over dielectric layer 24 (shown in FIGS. 1C and 1D above) for electrically isolating between nanosheets 33 of sub-device 21, as described in FIGS. 1A-1D above. In both configurations, dielectric layer 40 has a surface 25, which is typically flattened and coplanar with surface 14 of substrate 12.

In some embodiments, device 55 comprises a sub-device 44, which is formed of layer 40, directly over the footprint of sub-device 21. Sub-device 44 comprises a gate electrode, referred to herein as a gate 23, and two openings (not shown) similar to openings 77 of device 33 above. Moreover, in the present example, sub-device 44 comprises two nanosheets 33 that extend through the two respective openings in gate 23. Nanosheets 33 are coated with a suitable dielectric layer (not shown), such as dielectric layer 34 of FIG. 1A above. Note that nanosheets 33 of sub-device 44 are spaced away from nanosheets 33 of sub-device 21. In other words, at least in the present example, the nanosheets of the GAA FETs (of sub-devices 21 and 44) are electrically disconnected from one another.

In some embodiments, gate 23 is orthogonal to surfaces 14 and 25 along the Z-axis, and nanosheets 33 are orthogonal to: (i) surfaces 14 and 25 along the Z-axis, and (ii) gate 23 along the Y-axis, as described in more detail in the example configuration of device 11 of FIGS. 1A-1D above.

In the present example, sub-device 44 comprises (one or more, e.g.,) two p-gate GAA FETs, whose gate 23 is implanted with p-type ions, and the source and drain of nanosheets 33 are implanted with n-type ions. Each of the p-gate GAA FETs has a channel as described in the example of device 11 of FIG. 1A above. In this configuration, the p-gate GAA FETs of sub-device 44 comprise a npn junction formed at the channel between the p-type gate 23 and the n-type source and drain of nanosheets 33.

In some embodiments, the n-gate GAA FETs of sub-device 21 first footprint on surface 14 of substrate 12, and gate 22 has a footprint 30 along the X-axis of surface 14. The p-gate GAA FETs of sub-device 44 has a second footprint on surface 14 of substrate 12, which is smaller than and contained within the first footprint of sub-device 21. More specifically, gate 23 has a footprint 31 along the X-axis of surface 14, such that footprint 31 of gate 23 is smaller than and contained within footprint 30 of gate 22. In this configuration, the difference between footprints 30 and 31 is shown as a footprint 32 along the X-axis of device 55.

In the present example, device 55 comprises a complementary device having p-gate GAA FETs and n-gate GAA FETs. In the present configuration, gate 23 is smaller than gate 22, because p-gate GAA FETs are typically smaller than n-gate GAA FETs. In other embodiments, the p-gate GAA FETs and the n-gate GAA FETs may have a similar footprint. In yet other embodiments, device 55 may comprise any other suitable arrangement of one or more p-gate GAA FETs and/or one or more n-gate GAA FETs. For example, device 55 may comprise a stack of two sub-devices 21, so that instead of sub-device 44, device 55 comprises an additional sub-device 21.

Moreover, in the example of FIG. 2, the distal edge of sub-devices 21 and 44 are aligned along the Z-axis, so that footprint 32 is the difference between footprints 30 and 31. In other embodiments, sub-device 44 is located symmetrically relative to sub-device 21, such that footprint 32 is divided equally along the X-axis.

FIG. 3 is a schematic, pictorial illustration of terminals connected to semiconductor device 55 of FIG. 2, in accordance with an embodiment that is described herein.

In some embodiments, semiconductor device 55 comprises electrical contacts 41, 42 and 43, also referred to herein as first electrical contacts, which are configured to electrically connect between the p-gate GAA FETs of sub-device 21, and any suitable entity (e.g., a power source or one or more other GAA FETs) of device 55. Moreover, semiconductor device 55 comprises plates 35 and 36, which are coplanar with gate 22 and are configured to electrically connect between: (i) contact 41 and the source electrodes of nanosheets 33, and (ii) contact 42 and the drain electrodes of nanosheets 33. Furthermore, contact 43 is configured to directly connect between gate 22 and the entities described above.

In some embodiments, semiconductor device 55 further comprises electrical contacts 45, 46 and 47, also referred to herein as second electrical contacts, which are configured to electrically connect between the n-gate GAA FETs of sub-device 44, and any other suitable entities. Moreover, semiconductor device 55 comprises plates 37 and 38, which are coplanar with gate 23 and are configured to electrically connect between: (i) contact 45 and the source electrodes of nanosheets 33, and (ii) contact 46 and the drain electrodes of nanosheets 33. Furthermore, contact 47 is configured to directly connect between gate 23 and the entities described above.

In some embodiments, the first electrical contacts (e.g., contacts 41-43) have a third footprint on surface 14 of substrate 12, which is falling within the first footprint of sub-device 21 but outside the second footprint of sub-device 44. For example, contact 43 falls within footprint 32 along the X-axis. In some embodiments, the second electrical contacts (e.g., contacts 45-47) typically within the second fall footprint of sub-device 44. In this configuration, the footprint of device 55 does not exceed the footprint of sub-device 21, but comprises at least two sets of GAA FETs by stacking sub-device 44 over sub-device 21 along the Z-axis. This stacking of GAA FETs increases the capacity and functionality of device 55 compared to that of device 11 of FIG. 1A above. For example, in case devices 11 and 55 comprise signal processing devices, the stacking of GAA FETs increases the number of GAA FETs, and increases the processing power of device 55 over that of device 11.

FIG. 4 is a schematic, sectional view of a process sequence for fabricating nanosheets 33 of semiconductor devices 11 and 55, in accordance with an embodiment that is described herein.

The process sequence begins at an operation 50 with depositing over substrate 12 (i) dielectric layer 24 (which has a multilayered structure of the silicon dioxide ($SiO_2$) layer formed over surface 14 of substrate 12, and a silicon nitride ($Si_3N_4$) layer formed over the surface of the silicon dioxide layer, as described in FIG. 1C above), (ii) a silicon layer (typically a single crystalline silicon layer) having a thickness (along the Z-axis) between about 1 nm and 200 nm, which is intended to be patterned to nanosheets 33, (iii) dielectric layers 56, 60 and 58, which are intended to be sacrificial layers for patterning nanosheets 33 as will be described in the operations below, and (iv) a pattern of photoresist 57.

In some embodiments, the deposition of all the aforementioned layers is typically carried out using plasma chemical enhanced vapor deposition (PECVD) systems, such as the Producer family of products supplied by Applied Materials (3050 Bowers Avenue P.O. Box 58039. Santa Clara, CA 95054-3299), or the VECTOR® family of products supplied by Lam Research (44036 S. Grimmer Blvd. CA 94538). Moreover, the patterning of Fremont, photoresist 57 is carried our using a photolithography system, such as the NXE family of extreme ultra violet (EUV) products supplied by ASML (De Run 6501 5504 DR, Veldhoven, The Netherlands), or using a suitable immersion lithography system having a wavelength of 193 nm, such as the NXT family of products supplied by (i) ASML, (ii) Nikon Inc. (1399 Shoreway Road, Belmont, CA 94002-4107), and (iii) Canon semiconductor equipment Inc. (3577, Yoshiwara, Ohaza, Ami-machi, Inashiki-gun, Ibaraki 300-1195, Japan).

At an operation 51, layer 58 is removed and layer 60 is patterned by applying a sequence of reactive ion etching (RIE) processes using RIE systems, such as the Applied Materials Centura™ Dielectric Etcher and/or Lam Research Atomic Layer Etcher or Selective Etcher provided applied materials and/or Lam Research, respectively. Additionally, or alternatively, at least one of the RIE processes may be carried out using an Episode™ UL system, or a Tactras™ system, supplied by Tokyo Electron Ltd (Akasaka Biz Tower 3-1 Akasaka 5-chome, Minato-ku, Tokyo 107-6325, Japan)

In some embodiments, the pattern of layer 60 is also referred to herein as a mandrel mask, which is used for patterning a hard mask layer that is then covered with a new deposited layer, as will be described in detail herein.

At an operation 52, a spacer 62 is patterned at the sidewalls of pattern 60. In some embodiments, spacer 62 is formed by (i) depositing a dielectric layer over the outer surfaces of layers 56 and 60, and subsequently, (ii) etching back the dielectric layer for patterning spacer 62. In the present example, the deposition process step is carried out using any suitable type of the aforementioned PECVD tools, and the etch back process step is carried out using any suitable type of the aforementioned RIE tools.

In some embodiments, the process steps of operation 52 are also referred to herein as self-aligned patterning, because the patterning is carried out without applying any sort of mask. In the process sequence of operation 52, after the deposition step, the dielectric layer has a predefined thickness at the other surfaces of layers 56 and 60, and an excess (i.e., larger) thickness at the sidewalls of pattern 60. The thickness difference is caused by the step coverage and slope of the dielectric layer at the side walls of pattern 60. During the etch back step, the etching process removes the pre-defined thickness of the dielectric layer, and the excess thickness remains as spacer 62 at the sidewalls of pattern 60. In some embodiments, dielectric layer 56 is used as a sacrificial layer for preventing over-etching back into the silicon layer intended to be patterned for fabricating nanosheets 33.

At an operation 53, the mandrel mask of pattern 60 is removed using any suitable RIE or wet etching process. It is noted that also in operation 53, dielectric layer 56 is used as a sacrificial layer for preventing over-etching of the mandrel mask, into the silicon layer intended to be patterned for fabricating nanosheets 33. After concluding operation 53, the pattern of spacers 62 serves as a hard mask for fabricating nanosheets 33.

At an operation 54, a sequence of RIE process steps is applied for: (i) removing dielectric layer 56, and (ii) patterning nanosheets 33, and subsequently, an additional etching process step is removing spacers 62. Typically, the additional etching process step comprises wet etching, which is more selective than RIE, in order to prevent over etching that will undesirably reduce the intended thickness of nanosheets 33 and dielectric layer 24.

In some embodiments, operation 54 concludes the fabrication of nanosheets 33, but in other embodiments, the self-aligned patterning technique may be applied again for producing nanosheets having a smaller size at least along the X-axis. For example, the self-aligned patterning technique may be applied twice, by having two stacks of dielectric layers 56, 60 and 58, and repeating the sequence of operations 51-54. In some embodiments, by applying the self-aligned patterning technique twice, the number of nanosheets 33 will double from four nanosheets 33 (in the present example), to eight narrower nanosheets 33.

In some embodiments, the number of nanosheets 33 and the size thereof at least along the X-axis, can be tightly controlled by applying one or more sequences of the self-aligned patterning technique described in steps 50-54 above. Moreover, the self-aligned patterning technique of vertical channel nanosheets 33 simplifies the fabrication process and improves the electrical performance (i.e., the quality and reliability) of semiconductor device 11 and 55, compared to that of horizontal channel nanosheets that is described in the above overview section (before the description of FIG. 1A).

FIG. 5 is a flow chart that schematically illustrates a method for fabricating semiconductor devices 11 and 55, in accordance with an embodiment that is described herein. The operations of FIG. 5 are provided as separate operations, but some of the deposition and etching tools (such as the tools described in FIG. 4 above), are configured to carry out one or more of the operations within a single cluster of process chambers. Thus, one or more of the operations of FIG. 5, may be unified, but are described as separate operations for the sake of conceptual clarity.

Moreover, it is noted that a typical process for fabricating semiconductor devices 11 and 55 comprises at least several hundred (and optionally over one thousand) operations. Thus, the method described in FIG. 5 is highly simplified, with many operations and sub-operations being omitted for the sake of conceptual clarity.

The method begins at a first dielectric layer deposition operation 80 with depositing layer 24 over surface 14 of substrate 12, as described in detail in FIGS. 1 and 4 above.

At a semiconductor layer deposition operation 82, the silicon layer, which is intended to be patterned for fabricating nanosheets 33, is deposited over dielectric layer 24, as described in FIG. 4 above.

In some embodiments, after depositing dielectric layer 82 and before depositing the silicon layer intended to be patterned for fabricating nanosheets 33, an additional sacrificial dielectric layer (not shown) may be disposed between layer 24 and the silicon layer, so as to provide nanosheets 33 with a mechanical support before the formation of gate 22, as will be described below.

At a second dielectric layer deposition operation 84, one or more stacks of dielectric layers 56, 60 and 58 are formed over the silicon layer of operation 82 above, as described in detail in FIG. 4 above.

At a self-aligned patterning operation 86, vertical channel nanosheets 33 are fabricated using operations 50-54 of FIG. 4 above. It is noted that the self-aligned patterning process sequence of operations 50-54 may be carried out multiple times for reducing the size of nanosheets 33 along the X-axis of semiconductor devices 11 and 55, as described in detail in FIG. 4 above.

At a first gate formation operation 88, a polycrystalline silicon gate, also referred to herein as a polysilicon gate (not shown) is produced by depositing a polycrystalline silicon layer over layer 24 (or over the additional sacrificial dielectric layer described in operation 82 above). Moreover, additional spacers (not shown in FIGS. 1-4 above) are produced over the sidewalls of the polysilicon gate, using the technique described in operation 52 of FIG. 4 with necessary changes. It is noted that the additional spacers have openings 77 that are filled with nanosheets 33.

At a second gate formation operation 90, after the operation 88 first gate and spacers formation, a dielectric film also referred to herein as a blanket film (e.g., $SiO_2$ or carbon-doped $SiO_2$ for lower-k) is deposited to fill the gaps. Then the blanket dielectric layer is polished back (e.g., using dielectric Chemical Mechanical Planarization process) to expose the top surface of first the gates. Subsequently, the polycrystalline silicon gate is selectively removed (while the spacers and the deposited dielectric film in operation 90 are not removed). Subsequently, the stacked metal-based gate electrode, which is also referred to herein as gate 22, is formed. In the present example, gate 22 is formed by depositing and patterning a gate oxide layer such as hafnium oxide formed over a 2-3 Å of thin interfacial oxide (SiO₂) layer over the exposed nanosheets in the openings of gate 22, followed by deposition of a stack of metal gate layers comprising a titanium nitride layer, followed by a titanium aluminum layer, followed by a tungsten layer to fill up the openings of gate 22. A chemical mechanical planarization (CMP) process is typically used in a damascene manner to remove the excess layers on the top of the metal gates to isolate the neighboring metal gates to complete the formation of gate 22. It is noted that the configuration of gate 22, which is in accordance with the structure described in FIG. 1A above, is provided by way of example, and in other embodiments, gate 22 may have any other suitable structure, and may be fabricated using any other suitable process sequence. It is noted that gate 22 is formed at the location of, and instead of, the polycrystalline silicon gate of operation 88 above. Moreover, gate 22 is formed to surround nanosheets 33, which are positioned within openings 77, as described in FIGS. 1A-1D above. In some embodiments, during the fabrication process nanosheets 33 have been suspended by the stack of dielectric layers 24, which is described in FIG. 1C above. Additionally, or alternatively, an additional dielectric layer (such as the silicon nitride (Si₃N₄) layer is formed between (i) the outer surface of layer 24 and (ii) nanosheets 33. There are dielectric isolation materials such as Low-K (low permittivity in the range of 2.0 to 4.0 dielectric gap fill oxides) material between the nanosheets 33 as well. In other words, the empty spaces, other than the dummy polycrystalline silicon gates region, all have mechanical support from different dielectric films for their structural integrity.

In some embodiments, before the formation of gate 22, gate dielectric layer 34 may be formed over the outer surface of nanosheets 33, so that gate 22 is fabricated over dielectric layer 34. This process is carried out by applying a rapid thermal process (RTP) to the outer surface of nanosheets 33, using the Vantage Radox RTP system supplied by Applied Materials, or using any other suitable type of RTP system provided by any other supplier.

At a plate-fabrication operation 92, plates 35 and 36, which are coplanar with gate 22, are formed to surround the source and drain, respectively, as described in detail in FIG. 3 above.

In some embodiments, plates 35 and 36 may be formed by: (i) depositing a dielectric layer surrounding nanosheets 33, (ii) etching, in the dielectric layer, first and second trenches at the intended positions of plates 35 and 36, respectively, and (iii) filling the first and second trenches with a suitable metal layer (e.g., copper or aluminum or a suitable alloy thereof). The metal layer may be formed using a CVD process, a sputtering process, an electroplating process, or any suitable combination thereof.

In other embodiments, plates 35 and 36 may be formed by: (i) depositing a metal layer (e.g., aluminum alloy) surrounding nanosheets 33, and (ii) patterning the metal layer at the intended positions of plates 35 and 36, using any suitable lithography and metal etching systems. It is noted that the deposition and etching systems of the metal and dielectric layers is carried out using systems supplied by one or more of Applied Materials, Lam Research, and Tokyo Electron Ltd., whose contact details are described above.

At a contact formation operation 94, electrical contacts 41, 42 and 43 are formed over plates 35 and 36, and gate 22, respectively, as shown and described in detail in FIG. 3 above.

In some embodiments, electrical contacts 41, 42 and 43 may be formed by: (i) depositing dielectric layer 40, etching openings at the intended interface between (a) electrical contacts 41, 42 and 43 and (b) plates 35 and 36, and gate 22, respectively, and (c) forming electrical contacts 41, 42 and 43 using any suitable metal deposition system configured to fabricate a layer of copper or aluminum or a suitable alloy thereof.

In some embodiments, after concluding operation 94, the fabrication of sub-device 21 (which is similar to device 11 of FIG. 1A, with the addition of plates 35 and 36, and electrical contacts 41-43) of FIG. 3 is completed.

At a decision operation 96, a designer and manufacturer of the aforementioned semiconductor devices, decides whether or not an additional level of GAA FETs is required. In the present example, whether s/he wants to produce (i) device 11 having a single level of GAA FETs, or (ii) a device, such as device 55 having one or more additional levels of GAA FETs.

In case no additional levels of GAA FETs are required, the method proceeds to a passivation layer deposition operation 98 that concludes the method. At operation 98, a suitable passivation layer is produced for encapsulating the GAA FETs, and the semiconductor device is being packaged and tested using any suitable packaging, assembly, and testing processes.

In case additional levels of GAA FETs, such as the GAA FET of sub-device 44, are required, the method loops back to step 82. In the present example, semiconductor device 55 is 1 fabricated by applying a single loop back to step 82. In case a third level of GAA FETs is required, the method may loop back from operation 96 to operation 82 twice, and so forth for fabricating each additional level of GAA FETs.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A semiconductor device, comprising:

a semiconductor substrate;

a gate electrode disposed on a surface of the semiconductor substrate, the gate electrode comprising a plate, which is orthogonal to the surface, and having one or more openings, wherein a longest axis of at least one of the openings is orthogonal to the surface, wherein the one or more openings of the gate electrode have a rectangular shape;

one or more nanosheets having a rectangular cross section and a shape that fits in the one or more openings, respectively, the one or more nanosheets (i) are orthogonal both to the surface and to the gate electrode, (ii) extend through the one or more openings, respectively, and (iii) are surrounded by the gate electrode and spaced away from the surface, the one or more nanosheets comprising: (i) a first section that is located on a first side of the gate electrode and serves as a source, and (ii) a second section that is located on a second side of the gate electrode and serves as a drain, the gate electrode being configured to control movement of charge carriers between the source and the drain in response to an applied electrical signal;

first contacts comprising first and second plates, the first and second plates being disposed along first and second sides of the gate electrode, respectively, wherein the first plate is configured to electrically connect between the source and a first power source, and the second plate is configured to electrically connect between the drain and a second power source, wherein at least one of the first and second plates is: (i) disposed around the one or more nanosheets, and (ii) coplanar with the gate electrode; and one or more second contacts, the one or more second contacts being configured to electrically connect between the gate electrode and a third power source.

2. The semiconductor device according to claim 1, comprising a gate dielectric layer, which is disposed at the opening between the gate electrode and the nanosheets to form a gate all-around (GAA) field effect transistor (FET) having a vertical channel on one or more surfaces of the nanosheets between the source and the drain.

3. The semiconductor device according to claim 1, wherein the gate electrode and at least one of the nanosheets form a first gate all-around (GAA) field effect transistor (FET) having a first polarity, the semiconductor device further comprising a second GAA FET that is stacked over the first GAA FET, the second GAA FET having a second polarity that is different from the first polarity.

4. A semiconductor device, comprising:

a semiconductor substrate;

a gate electrode disposed on a surface of the semiconductor substrate, the gate electrode comprising a plate, which is orthogonal to the surface, and having one or more openings, wherein a longest axis of at least one of the openings is orthogonal to the surface, wherein the one or more openings of the gate electrode have a rectangular shape; and one or more nanosheets having a rectangular cross section and a shape that fits in the one or more openings, respectively, the one or more nanosheets (i) are orthogonal both to the surface and to the gate electrode, (ii) extend through the one or more openings, respectively, and (iii) are surrounded by the gate electrode and spaced away from the surface, the one or more nanosheets comprising: (i) a first section that is located on a first side of the gate electrode and serves as a source, and (ii) a second section that is located on a second side of the gate electrode and serves as a drain, the gate electrode being configured to control movement of charge carriers between the source and the drain in response to an applied electrical signal;

wherein the gate electrode and at least one of the nanosheets form a first gate all-around (GAA) field effect transistor (FET) having a first polarity, the semiconductor device further comprising a second GAA FET that is stacked over the first GAA FET, the second GAA FET having a second polarity that is different from the first polarity; and wherein the second GAA FET comprises:

an additional gate electrode, the additional gate electrode comprising an additional plate that orthogonal to the surface and that is coplanar with the gate electrode of the first GAA FET; and one or more additional nanosheets, the additional nanosheets (i) being orthogonal both to the surface and to the additional gate electrode, (ii) extending through at least one opening in the additional gate electrode, and (iii) being surrounded by the additional gate electrode and spaced away from the nanosheets of the first GAA FET.

5. The semiconductor device according to claim 4 and comprising electrical contacts which extend from at least the gate electrode of the first GAA FET and which pass alongside the second GAA FET, the electrical contacts being configured to connect between the first GAA FET and a power source.

6. The semiconductor device according to claim 5, wherein the first GAA FET has a first footprint on the surface, wherein the second GAA FET has a second footprint on the surface that is smaller than and contained within the first footprint, wherein the electrical contacts have a third footprint on the surface, falling within the first footprint but outside the second footprint.

7. The semiconductor device according to claim 3 and comprising a dielectric layer, the dielectric layer being: (i) disposed between the first GAA FET and the second GAA FET, and (ii) configured to electrically isolate between the first GAA FET and the second GAA FET.

8. A method for fabricating a semiconductor device, the method comprising:

disposing, on a surface of a semiconductor substrate, a gate electrode comprising a plate, which is orthogonal to the surface, the plate having one or more openings, wherein a longest axis of at least one of the openings is orthogonal to the surface, wherein the one or more openings of the gate electrode have a rectangular shape;

forming one or more nanosheets having a rectangular cross section corresponding to the rectangular shape of the one or more openings, the one or more nanosheets (i) being orthogonal both to the surface and to the gate electrode, (ii) extending through the one or more openings, respectively, and (iii) being surrounded by the gate electrode and spaced away from the surface, forming the one or more nanosheets comprises (i) positioning a first section of the one or more nanosheets on a first side of the gate electrode to serve as a source, and (ii) positioning a second section of the one or more nanosheets on a second side of the gate electrode to serve as a drain;

forming, along first and second sides of the gate electrode, first contacts comprising first and second plates, respectively, the first plate for electrically connecting between the source and a first power source, and the second plate for electrically connecting between the drain and a second power source, wherein forming at least one of the first and second plates comprises forming the at least one of the first and second plates (i) around the one or more nanosheets, and (ii) coplanar with the gate electrode; and forming one or more second contacts for electrically connecting between the gate electrode and a third power source.

9. The method according to claim 8, wherein forming the one or more nanosheets comprises: (i) disposing on the semiconductor substrate at least a semiconductor layer and a stack of dielectric layers, (ii) patterning a mandrel mask in at least one of the dielectric layers of the stack, (iii) patterning a spacer at sidewalls of the mandrel mask and removing the mandrel mask, and (iv) patterning the nanosheets in the semiconductor layer by transferring a pattern of the spacer to the semiconductor layer.

10. The method according to claim 8 and comprising disposing at the opening, between the gate electrode and the nanosheets, a gate dielectric layer for producing a gate all-around (GAA) field effect transistor (FET) having a vertical channel on one or more surfaces of the nanosheets.

11. The method according to claim 8, wherein the gate electrode and at least one of the nanosheets form a first gate all-around (GAA) field effect transistor (FET) having a first polarity, comprising forming a second GAA FET, which is stacked over the first GAA FET and has a second polarity, different from the first polarity.

12. The method according to claim 11 and comprising forming electrical contacts extending from at least the gate electrode of the first GAA FET and pass alongside the second GAA FET, the electrical contacts being configured to connect between the first GAA FET and a power source.

13. The method according to claim 12, wherein forming the first GAA FET comprises disposing the first GAA FET having a first footprint on the surface, wherein forming the second GAA FET comprises disposing the second GAA FET having a second footprint on the surface, smaller than and contained within the first footprint, and wherein forming the electrical contacts comprises positioning the electrical contacts having a third footprint on the surface, falling within the first footprint but outside the second footprint.

14. The method according to claim 11 and comprising forming a dielectric layer between the first GAA FET and the second GAA FET to electrically isolate between the first GAA FET and the second GAA FET.

\*   \*   \*   \*   \*